(12) United States Patent
Menon et al.

(10) Patent No.: US 8,924,786 B2
(45) Date of Patent: Dec. 30, 2014

(54) NO-TOUCH STRESS TESTING OF MEMORY I/O INTERFACES

(75) Inventors: Sankaran M. Menon, Austin, TX (US); Robert R. Roeder, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 13/536,372

(22) Filed: Jun. 28, 2012

(65) Prior Publication Data

US 2014/0006864 A1 Jan. 2, 2014

(51) Int. Cl.
*G06F 11/00* (2006.01)

(52) U.S. Cl.
USPC .............................. 714/25; 714/718

(58) Field of Classification Search
CPC ............................... G11C 29/56; G06F 11/221
USPC .................................................... 714/25, 718
See application file for complete search history.

(56) References Cited

U.S. PATENT DOCUMENTS

| | | | |
|---|---|---|---|
| 7,979,757 B2 * | 7/2011 | Jeddeloh ........................ | 714/718 |
| 8,242,589 B2 * | 8/2012 | Saen et al. ..................... | 257/686 |
| 8,521,979 B2 * | 8/2013 | LaBerge et al. ............... | 711/167 |
| 8,593,170 B2 * | 11/2013 | Van der Plas et al. ... | 324/762.03 |
| 2002/0012283 A1 * | 1/2002 | Ernst et al. ..................... | 365/201 |
| 2007/0050167 A1 | 3/2007 | Johnson | |
| 2010/0005376 A1 * | 1/2010 | LaBerge et al. ............... | 714/819 |
| 2010/0095168 A1 * | 4/2010 | Jeddeloh ........................ | 714/720 |
| 2010/0164527 A1 | 7/2010 | Weyh et al. | |
| 2012/0054566 A1 * | 3/2012 | Gupta et al. .................. | 714/723 |
| 2012/0159271 A1 * | 6/2012 | Cho et al. ...................... | 714/717 |

FOREIGN PATENT DOCUMENTS

KR    10-2010-0114697    10/2010

OTHER PUBLICATIONS

International Search Report and Written Opinion of the International Searching Authority dated Aug. 28, 2013, in International Patent Application No. PCT/US2013/043483, 11 pages.
JEDEC Standard, Wide I/O Single Data Rate (Wide I/O SDR) JESD229, JEDEC Solid State Technology Association, Dec. 2011, 74 pages.

* cited by examiner

*Primary Examiner* — Yolanda L Wilson
(74) *Attorney, Agent, or Firm* — Blakely, Sokoloff, Taylor & Zafman LLP

(57) ABSTRACT

Embodiments are generally directed no-touch stress testing of memory input/output (I/O) interfaces. An embodiment of a memory device includes a system element to be coupled with a dynamic random-access memory (DRAM), the system element including a memory interface for connection with the DRAM, the interface including a driver and a receiver, a memory controller for control of the DRAM, and a timing stress testing logic for testing of the I/O interface.

26 Claims, 7 Drawing Sheets

NO-TOUCH STRESS TESTING OF MEMORY I/O INTERFACES

TECHNICAL FIELD

Embodiments of the invention generally relate to the field of electronic devices and, more particularly, no-touch stress testing of memory I/O interfaces.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as the strata of a memory stack. Stacked memory may be utilized to provide a great amount of computer memory in a single device or package, where the device or package may also include certain system components, such as a memory controller and CPU (central processing unit).

The development of stacked memory and other similar memory architecture requires testing of such devices, where the testing may include testing of memory and testing of I/O (input/output) links.

However, the structure of stacked memory devices provides challenges to effective testing. In particular, the stacked memory device architecture contains micro-bump connections that cannot be accessed for testing of the memory interface, and thus conventional testing is not usable for such devices.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
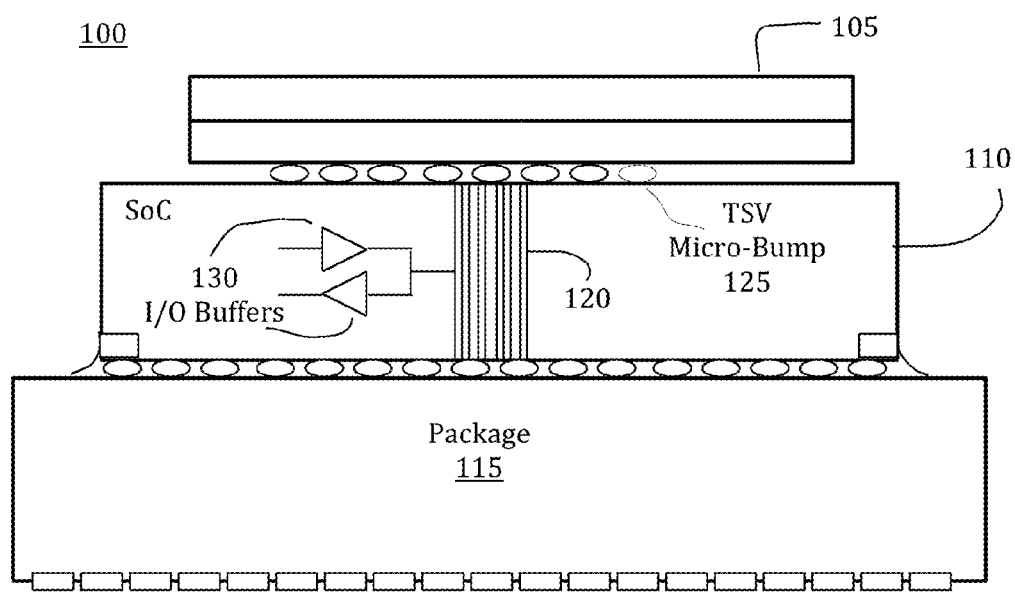
FIG. 1 illustrates an embodiment of a combined memory device including SOC and attached stacked memory.

Embodiments of the invention are generally directed to no-touch stress testing of memory I/O interfaces.

As used herein:

"3D stacked memory" (where 3D indicates three-dimensional) or "stacked memory" means a computer memory including one or more coupled memory die layers, memory packages, or other memory elements. The memory may be vertically stacked or horizontally (such as side-by-side) stacked, or otherwise contain memory elements that are coupled together. In particular, a stacked memory DRAM device or system may include a memory device having a plurality of DRAM die layers (or strata). A combined memory device may also include system elements in the device, which may be referred to herein as a system layer or element, where the system layer may include elements such as a CPU (central processing unit), a memory controller, and other related system elements. The system layer may include a system on chip (SoC). In some embodiments, the system layer may be an application processor or graphics processing unit (GPU).

With the advent of the stacked DRAM standard (such as the WideIO standard), the DRAM dies may be stacked with a system element such as an SoC die in the same package with a memory stack, forming a combined memory device. The stacked memory and SOC may utilize through silicon via (TSV) manufacturing techniques, where vias are produced through silicon dies to provide signal paths through the memory stack. The combined memory device may have one or more DRAM chips or other memory devices such as Flash or SRAM devices, these chips forming memory strata or layers coupled with the system chip. Each memory stratum may include a plurality of tiles (or portions) of memory. The stacked memory device may include multiple channels, where a channel may include a column of tiles, such as a tile in each of the strata of the memory stack.

However, a device may develop flaws in manufacturing, and thus requiring effective testing of the memory I/O interface. In particular, the WideIO TSV drivers and receivers require testing during high volume manufacturing to ensure that such elements meet the specifications for both set up and hold timing.

The WideIO TSV driver and receiver run at 1× speed as opposed to the external DRAM (which runs at 2× to 4× data-rate). In some embodiments, in order to test and to ensure that the driver and receiver meet the specification requirements, an apparatus or system is provided that includes an I/O Pattern generator that provides pattern for exercising the I/O driver and receiver.

In some embodiments, the apparatus or system enables testing the 1× TSV 3D stack memory interface for set up and hold using auto-timing methodology. The testing may be utilized to save time during high-volume manufacturing, where testing may include testing of a memory I/O interface prior to attachment of a memory stack and testing of such interface with attached memory. In addition, the TSV micro-bumps cannot be touched by tester probes, and timing stress testing enables testing to be accomplished without the tester being required to touch the micro-bumps. In some embodiments, initial parts are to be characterized to develop the distribution of the set up and hold timings in order to narrow the search by the auto-timing logic.

FIG. 1 illustrates an embodiment of a combined memory device including an SOC and attached stacked memory. In some embodiments, a combined memory device 100, which may be a Wide IO compatible device, includes a memory stack 105 that many contain any number of memory strata. The combined memory device 100 further includes a system layer, such as SoC 110, the SoC being coupled with the memory stack 105 by a plurality of TSV micro-bumps 125.

As illustrated, the SoC may include a plurality of TSVs 120, where the TSVs 120 may provide connections to the memory stack 105. SoC 110 includes I/O buffers for each of the TSVs, the I/O buffers employ a driver to drive data to the memory and a receiver to receive data from the memory via the micro-bump connection with the memory stack 105 for the TSV. The SoC 110 is further connected to a package 115 to form the combined memory device with SoC and attached stacked memory 100.

However, the I/O buffers 130 inside the SoC require testing both for characterization of devices, and for failure testing of individual units. The micro-bumps are too small to provide physical access to the I/O for testing. In some embodiments, the SoC provides for no-touch testing of the I/O interface from the SoC 115. In some embodiments, the no-touch testing includes providing test patterns to stress the I/O elements, the testing including characteristic testing of the memory I/O interface to determine characteristics of a particular type of memory interface, and failure testing to determine if an individual memory interface meets threshold requirements.

Figure 2:
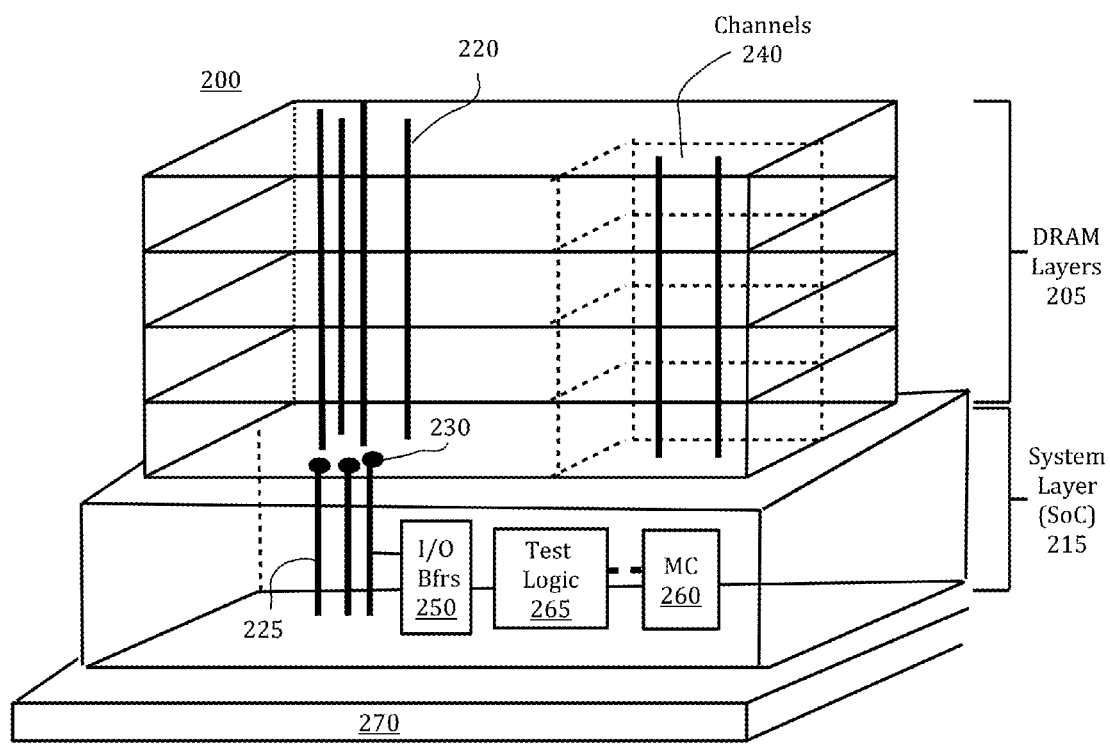
FIG. 2 is an embodiment of a combined memory device architecture.

FIG. 2 is an embodiment of an architecture of a combined memory device. In this illustration (which is not drawn to scale), a combined memory 200 includes one or more DRAM layers 205 coupled with an SoC 215, where the SoC may be further coupled with a package 270. The memory layers 205 may be connected by a number of TSVs 220, and may be divided into multiple channels 240. The SoC further includes multiple TSVs 225, where the TSVs 225 of the SoC 215 are coupled with the DRAM layers 205 by a number of micro-bumps 230. The SoC includes I/O interface buffers 250 to drive data signals to the memory of the DRAM layers 205 and to receive data signals from the memory.

The SoC 215 further includes a memory controller 260. In some embodiments, the SoC also includes timing stress test logic 265 (which may be a portion of the memory controller 260 in some implementations) to perform stress testing of the I/O interface buffers 250 of interface of the SoC for connection to the DRAM memory layers 205, where the test logic 265 allows for no-touch testing of the I/O interface buffers 250 without external access to the micro-bump connections 230. In some embodiments, the test logic 265 allows for stress testing of the I/O drivers to characterize the type or class of memory I/O interface, and for failure testing to determine whether a manufactured memory device interface meets a threshold operation.

Figure 3:
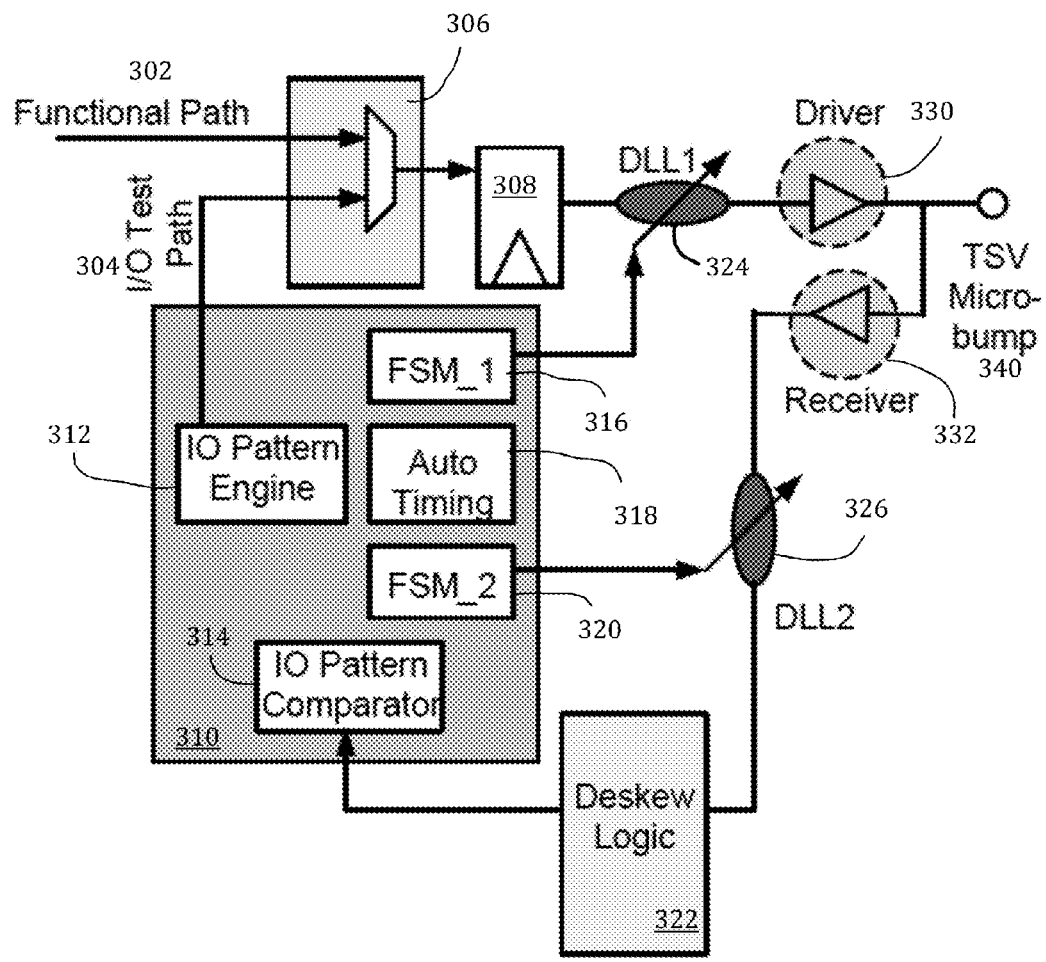
FIG. 3 is an illustration of an embodiment of timing stress logic for a memory I/O interface.

FIG. 3 is an illustration of an embodiment of timing stress test logic for a memory I/O interface. FIG. 3 illustrates certain components of an SoC of a combined memory device, such as SoC 215 illustrated in FIG. 2. In some embodiments, the SoC includes timing stress test logic 300 to provide for timing stress testing of memory I/O interface buffers, shown as driver 330 and receiver 332, which are coupled with a TSV micro-bump 340.

In some embodiments, the test logic includes a multiplexer (mux) 306 to select a signal path, where the signal path may be either a functional path for normal access to the I/O buffers and an I/O test path 304 to connect to an I/O pattern engine 312 of testing components 310. An output of the multiplexer 306 is coupled with a latch 308. In some embodiments, an output of the latch 308 is coupled with a first digital delay locked loop (DLL1) 324, which is coupled with the driver 330. The corresponding receiver 332 is coupled with a second digital delay locked loop (DLL2) 326. DLL2 is further coupled with deskew logic 322, which provides an output to and I/O pattern comparator 314.

In some embodiments, the multiplexer 306 is switchable upon receiving a signal to choose the I/O test path 304 in a testing state. In some embodiments, the I/O pattern engine 312 provides a test pattern for the testing of the driver 330 and receiver 332, where the I/O pattern engine may be programmable to provide any required test pattern. In some embodiments, test pattern data held by the latch 308 is subject to delay by DLL1 324, where the amount of delay for DLL1 is set by a first finite state machine (FSM_1) 316. In some embodiments, the delayed signals are driven by driver 330 and receiver 332. In some embodiments, the signals provided by receiver 332 are subject to delay by DLL2 326, where the amount of delay is set by a second finite state machine (FSM_2) 320.

In some embodiments, DLL1 324 is used to provide timing stress for the set up and hold for the I/O buffers, with DLL2 326 providing additional timing stress in the receive path. In some embodiments, the deskew logic 322 is used to deskew the output signals received via DLL2 326, where the deskewed output is then provided to the I/O pattern comparator 314. The I/O pattern comparator operates to compare the received output from the test pattern provided by the I/O pattern engine 312, and based on such comparison to determine pass or fail of the I/O interface.

In some embodiments, in a search test to establish a characterization of combined memory devices, an auto time component 318 directs FSM_1 316 and FSM_2 320 to increment or shift the DLL1 and DLL2 respectively through delay values to stress the driver 330 and receiver 332 until a failure is reached, where such failure in a number of individual units may be used to establish failure values for the combined memory device, such as in a curve of FSM values. In some embodiments, the auto-timing logic 318 operates to set the FSM value to the appropriate values to test the set up/hold in a failure test of the driver and receiver.

In some embodiments, testing of a memory I/O interface may include search testing of a memory I/O interface to characterize the interface by determining a failure threshold for the memory I/O interface, or failure testing of a memory I/O interface to determine passage or failure of an individual unit. In some embodiments, testing may include testing of a combined device with SoC and attached memory, or testing of an SoC prior to or without attachment of memory.

Figure 4:
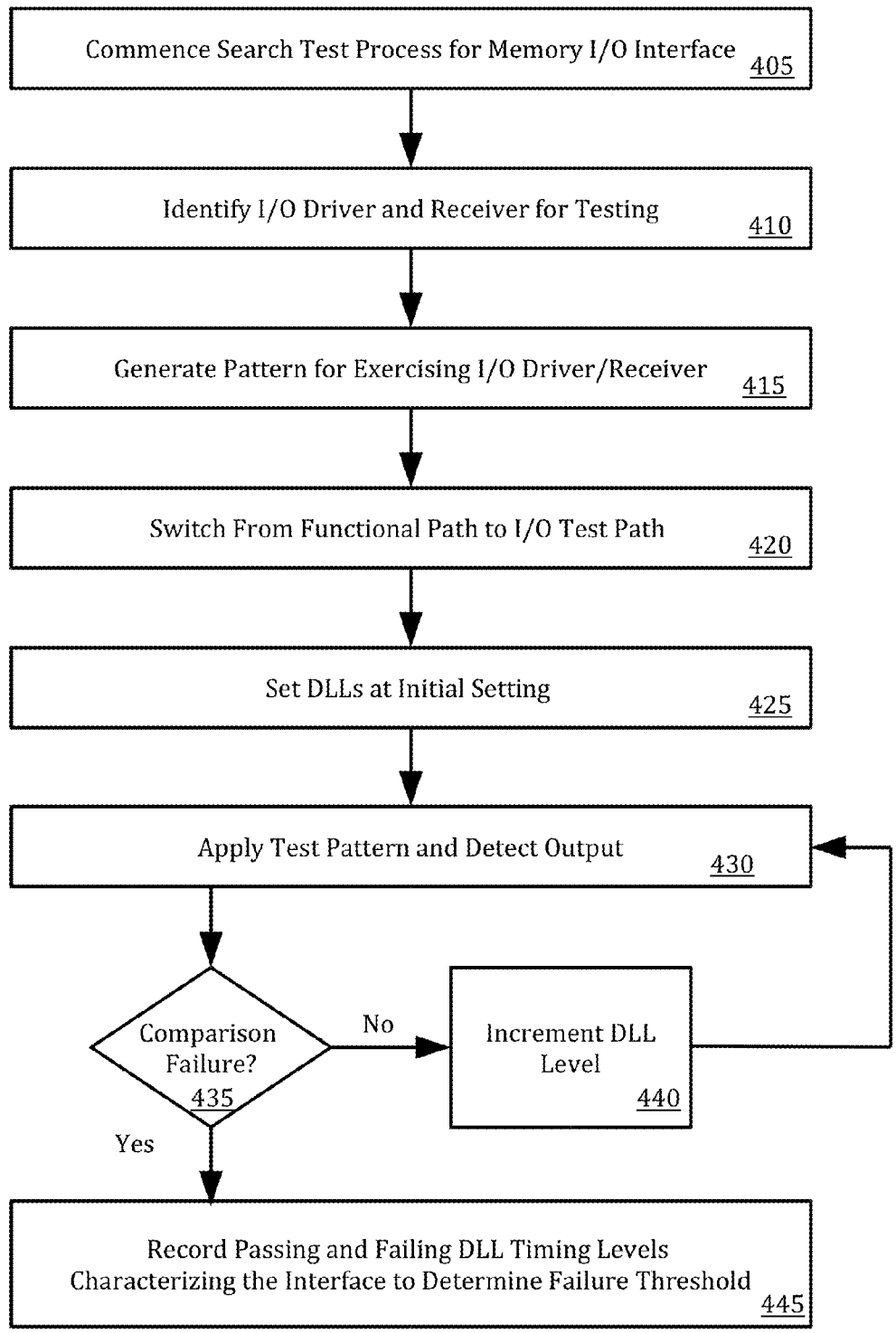
FIG. 4 is a flowchart to illustrate an embodiment of a method for search testing of a memory I/O interface.

FIG. 4 is a flowchart to illustrate an embodiment of a method for search testing of a memory I/O interface. In some embodiments, search testing may be conducted on a memory I/O interface of a memory SoC without memory being attached to the memory SoC. In some embodiments, upon commencing a search test process for a memory I/O interface 405 and identifying the I/O driver and receiver for no-touch stress testing 410, a test pattern is generated for exercising the I/O driver and receiver 415. In some embodiments, there is a switch from a functional path to an I/O test path 420, such as by providing a signal to a multiplexer to choose the test path.

In some embodiments, DLLs for timing stress testing, such as a first DLL in a path to the I/O driver and a second DLL in a path from the I/O receiver, are set to an initial setting for the timing stress test 425, where the initial setting may be a minimal delay by the DLLs. In some embodiments, the test pattern is applied to the test path, and the returning output from the test path is detected for testing 430.

In some embodiments, if a failure in a comparison of the resulting output with the test pattern is not reached at the current DLL settings 435, then the DLLs may be incremented 440 in order to provide greater timing stress on the memory I/O interface. The DLL setting may be iteratively increased until there is a failure in the comparison between the resulting output and the test pattern 435. In some embodiments, the process may provide for recording passing and failing DLL timing delays characterizing the memory I/O interface to determine a failure threshold for the combined memory device 445.

Figure 5:
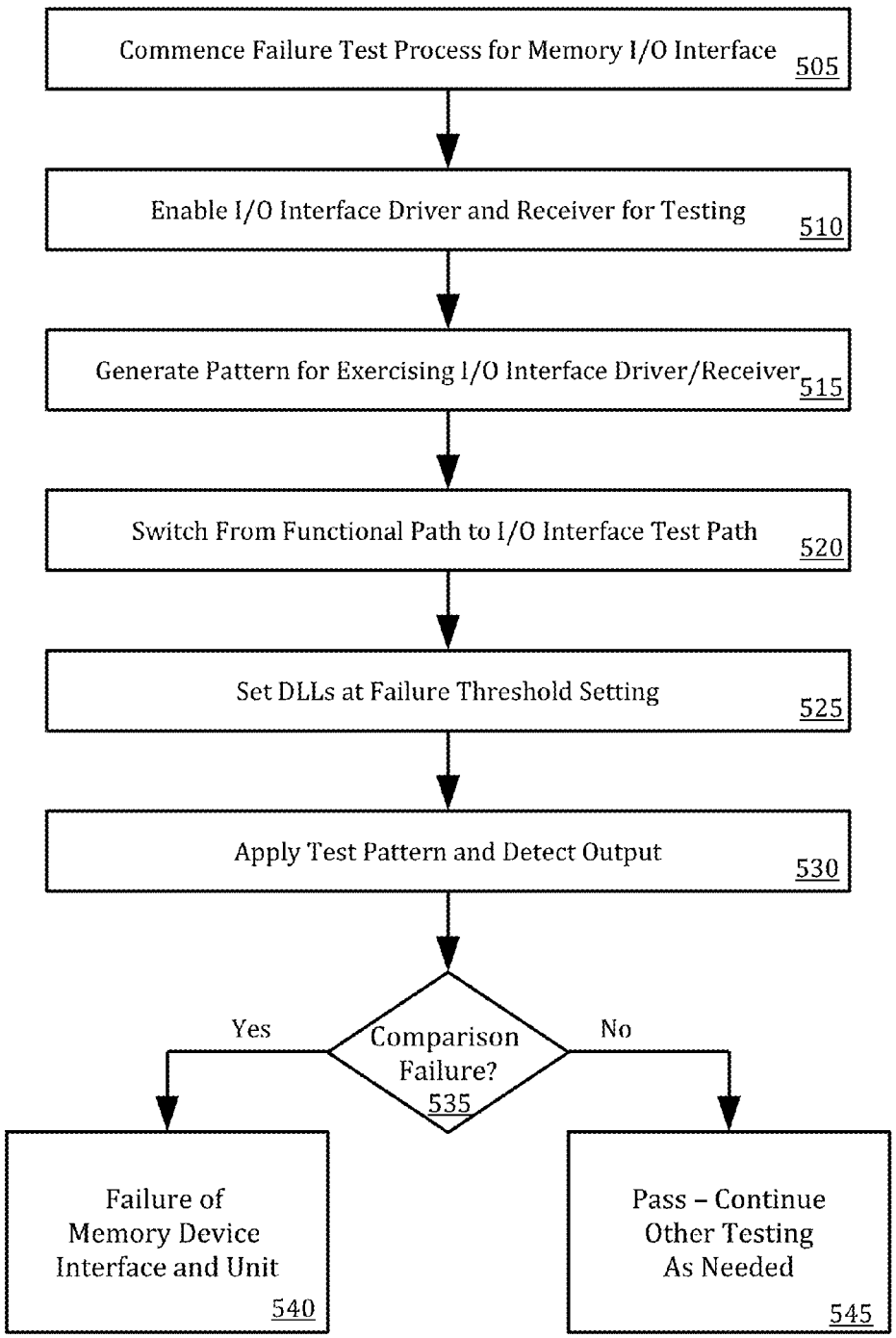
FIG. 5 is a flowchart to illustrate an embodiment of a method for fail limit testing of a memory I/O interface.

FIG. 5 is a flowchart to illustrate an embodiment of a method for failure testing of a memory I/O interface. In some embodiments, upon commencing a failure test process for a memory I/O interface 505 and enabling the I/O interface driver and receiver for no-touch stress testing 510, a test pattern is generated for exercising the I/O driver and receiver 515. In some embodiments, there is a switch from a functional path to an I/O test path 520, such as by providing a signal to a multiplexer to choose the test path.

In some embodiments, DLLs for timing stress testing, such as a first DLL in a path to the I/O driver and a second DLL in a path from the I/O receiver, are set to an failure threshold setting for the timing stress test 525, where the failure threshold may be established using a characterization of the memory I/O interface, which may include the process illustrated in FIG. 4. In some embodiments, the test pattern is applied to the test path, and the returning output from the test path is detected for testing 530.

In some embodiments, if a failure in a comparison of the resulting output with the test pattern is not reached at the failure threshold DLL settings 535, then the I/O interface passes the timing stress testing, and testing of the combined memory device unit may continue with any other testing 545. In some embodiments, if a failure in a comparison of the resulting output with the test pattern is reached at the failure threshold DLL settings 535, then the memory device fails the timing stress testing process 540.

Figure 6:
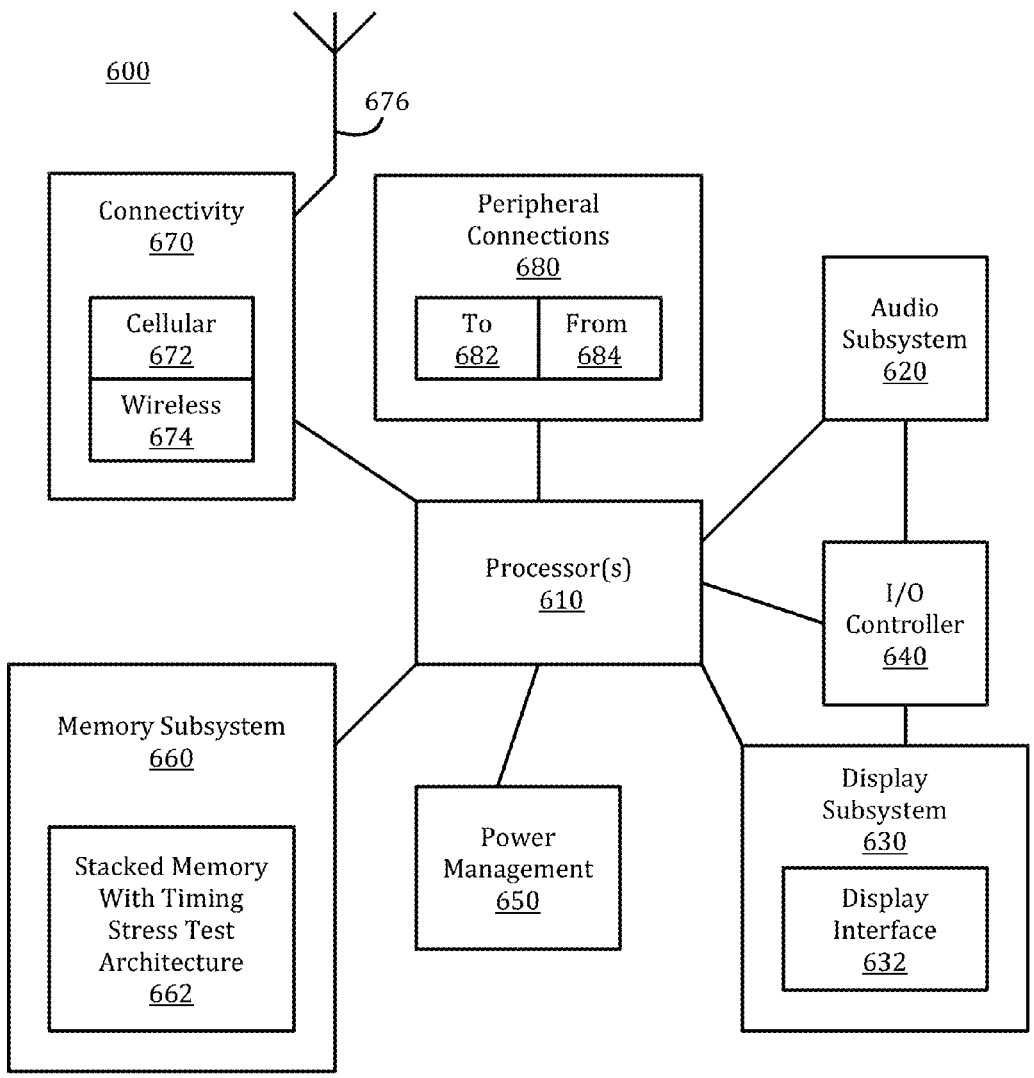
FIG. 6 is an illustration of an embodiment of an apparatus or system including elements for timing stress testing of memory I/O interface.

FIG. 6 is an illustration of an embodiment of a computing device including elements for timing stress testing of memory. Computing device 600 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 600. The components may be connected by one or more buses or other connections.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as system data (whether long-term or temporary) related to the execution of the applications and functions of system 600.

In some embodiments, the memory subsystem 660 may include a stacked memory device 662, wherein the stacked memory device includes a timing stress test architecture, including, for example, the timing stress logic illustrated in FIG. 3.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 676.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 7:
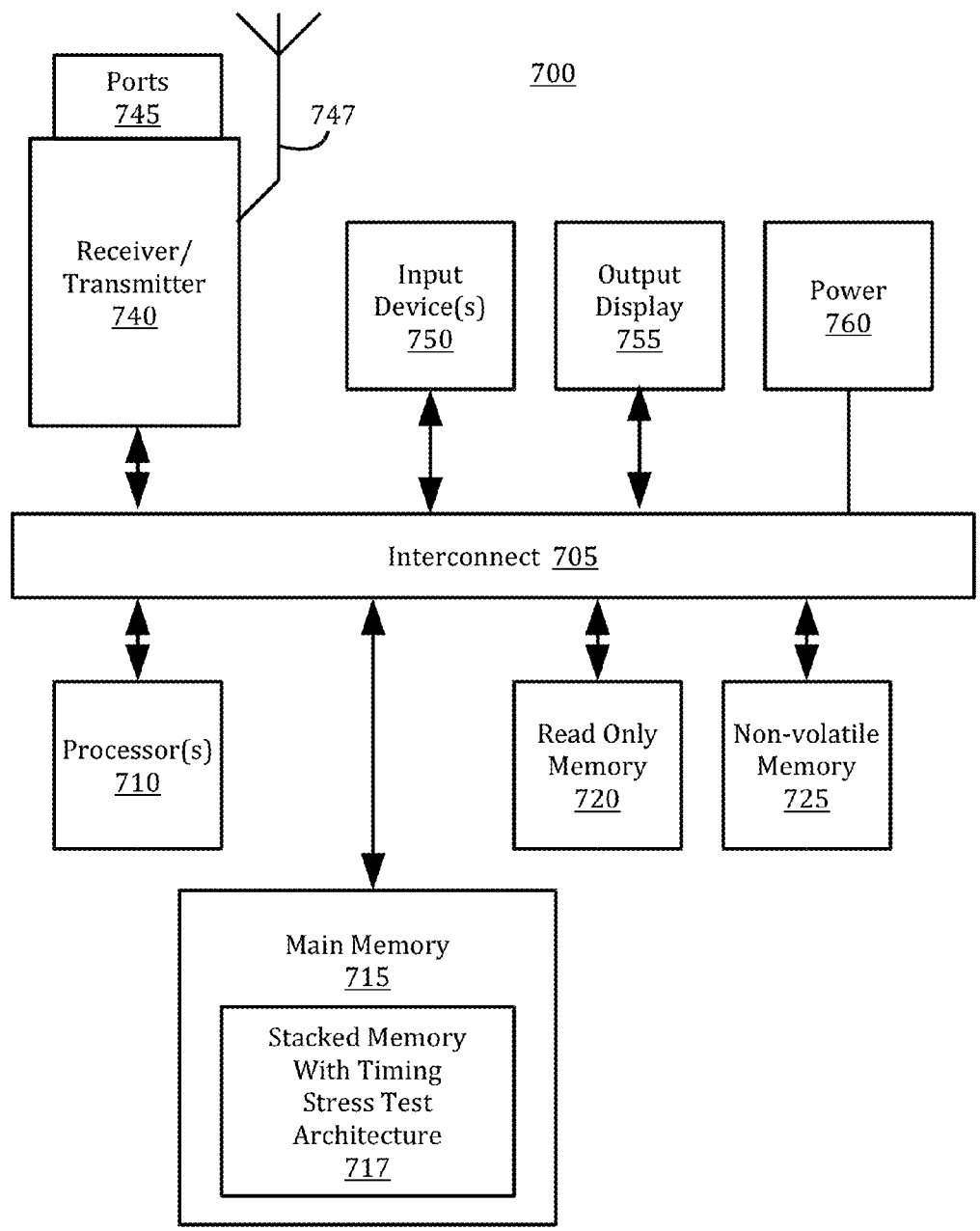
FIG. 7 an embodiment of a computing system including stacked memory having elements for timing stress testing of memory I/O interface.

FIG. 7 an embodiment of a computing system including elements for timing stress testing of memory. The computing system may include a computer, server, game console, or other computing apparatus. In this illustration, certain standard and well-known components that are not germane to the present description are not shown. Under some embodiments, the computing system 700 comprises an interconnect or crossbar 705 or other communication means for transmission of data. The computing system 700 may include a processing means such as one or more processors 710 coupled with the interconnect 705 for processing information. The processors 710 may comprise one or more physical processors and one or more logical processors. The interconnect 705 is illustrated as a single interconnect for simplicity, but may represent multiple different interconnects or buses and the component connections to such interconnects may vary. The interconnect 705 shown in FIG. 7 is an abstraction that represents any one or more separate physical buses, point-to-point connections, or both connected by appropriate bridges, adapters, or controllers.

In some embodiments, the computing system 700 further comprises a random access memory (RAM) or other dynamic storage device or element as a main memory 715 for storing information and instructions to be executed by the processors 710. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 715 includes stacked memory 717, wherein the stacked memory device includes a timing stress test architecture, including, for example, the timing stress logic illustrated in FIG. 3.

The computing system 700 also may comprise a read only memory (ROM) 720 or other static storage device for storing static information and instructions for the processors 710. The computing system 700 may include one or more non-volatile memory elements 725 for the storage of certain elements.

One or more transmitters or receivers 740 may also be coupled to the interconnect 705. In some embodiments, the computing system 700 may include one or more ports 745 for the reception or transmission of data. The computing system 700 may further include one or more omnidirectional or directional antennas 747 for the reception of data via radio signals.

In some embodiments, the computing system 700 includes one or more input devices 750, where the input devices include one or more of a keyboard, mouse, touch pad, voice command recognition, gesture recognition, or other device for providing an input to a computing system.

The computing system 700 may also be coupled via the interconnect 705 to an output display 755. In some embodiments, the display 755 may include a liquid crystal display (LCD) or any other display technology, for displaying information or content to a user. In some environments, the display 755 may include a touch-screen that is also utilized as at least a part of an input device. In some environments, the display 755 may be or may include an audio device, such as a speaker for providing audio information.

The computing system 700 may also comprise a power device or system 760, which may comprise a power supply, a battery, a solar cell, a fuel cell, or other system or device for providing or generating power. The power provided by the power device or system 760 may be distributed as required to elements of the computing system 700.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, an apparatus includes a system element to be coupled with a DRAM, the system element including a memory I/O interface for connection with the DRAM, the interface including a driver and a receiver, a memory controller for control of the DRAM, and a timing stress testing logic for testing of the memory I/O interface.

In some embodiments, the timing stress testing logic of the apparatus includes a multiplexer to choose between a functional path and a test path, a pattern generator to generate a test pattern, one or more DLLs to provide delays in the test path, and an I/O pattern comparator to compare resulting signals from the memory I/O interface to the test pattern to determine passing or failing of the memory I/O interface.

In some embodiments, the one or more DLLs of the apparatus include a first DLL coupled with the driver and a second DLL coupled with the receiver. In some embodiments, the apparatus further includes a first finite state machine to set a delay of the first DLL and a second finite state machine to set a delay of the second DLL.

In some embodiments, the apparatus further includes an auto-timing component to control operation of the first finite state machine and the second finite state machine. In some embodiments, the auto-timing component is operable to increment the first finite state machine and the second finite state machine through a plurality of increasing delay values for a characterization test of the memory device. In some embodiments, the auto-timing component is operable to set the first finite state machine and the second finite state machine at threshold levels for a failure test of the memory I/O interface.

In some embodiments, the driver and receiver are coupled in the memory I/O interface with a micro-bump connection. In some embodiments, the system element of the apparatus includes a plurality of through silicon vias (TSVs), including a first TSV coupled with the micro-bump.

In some embodiments, the memory controller and timing stress testing logic are separate elements of the system element. In some embodiments, the timing stress testing logic is a portion of the system element. In some embodiments, the system element is an SoC.

In some embodiments, the apparatus further includes a memory stack coupled with the system element, the memory stack including one or more DRAM layers.

In some embodiments, a method includes commencing a test process for a memory I/O interface; generating a test pattern for the memory I/O interface; switching a signal path to an I/O interface test path, wherein the signal path may be switched to either the I/O interface test path or a functional path; setting one or more delays for the signal path; applying the test pattern to the memory I/O interface and detecting an output from the memory I/O interface; and comparing the output from the memory I/O interface with the test pattern.

In some embodiments, the test is a search test to characterize the memory I/O interface. In some embodiments, setting the one or more delays includes setting the one or more delays at an initial setting. In some embodiments, the method further includes incrementing the one or more delays for a subsequent comparison if the comparison between the output and the test pattern does not indicate a failure. In some embodiments, the method further includes characterizing the memory I/O interface based upon one or more comparisons between the output of the memory I/O interface and the test pattern.

In some embodiments, the test is a failure test for a unit including the memory I/O interface. In some embodiments, setting the one or more delays for the signal path includes setting the delays at a failure threshold setting. In some embodiments, the failure threshold setting is established by a characterization test of the memory I/O interface.

In some embodiments, the test process occurs without attachment of memory to the memory I/O interface.

In some embodiments, a system includes a processor to process data for the system; a transmitter, receiver, or both coupled with an omnidirectional antenna to transmit data, receive data, or both; and a combined memory device including an SoC and a memory stack including one or more DRAM layers, the memory stack being coupled to SoC by a micro-bump connection, the system element includes a plurality of through silicon vias (TSVs), including a first TSV coupled with a first micro-bump. In some embodiments, the SoC includes a memory I/O interface, the interface including a driver and a receiver, a memory controller for control of the DRAM, and a timing stress testing logic for testing of the memory I/O interface.

In some embodiments, the timing stress testing logic of the system includes a multiplexer to choose between a functional path and a test path, a pattern generator to generate a test pattern, one or more DLLs to provide delays in the test path, and an I/O pattern comparator to compare resulting signals from the memory I/O interface to the test pattern to determine passing or failing of the memory I/O interface.

In some embodiments, the one or more DLLs of the system include a first DLL coupled with the driver and a second DLL coupled with the receiver. In some embodiments, the system further includes a first finite state machine to set a delay of the first DLL and a second finite state machine to set a delay of the second DLL. In some embodiments, the system further includes an auto-timing component to control operation of the first finite state machine and the second finite state machine.

In some embodiments, a non-transitory computer-readable storage medium having stored thereon data representing sequences of instructions that, when executed by a processor, cause the processor to perform operations including commencing a test process for a memory I/O interface; generating a test pattern for the memory I/O interface; switching a signal path to an I/O interface test path, wherein the signal path may be switched to either the I/O interface test path or a functional path; setting one or more delays for the signal path; applying the test pattern to the memory I/O interface and detecting an output from the memory I/O interface; and comparing the output from the memory I/O interface with the test pattern.

What is claimed is:

1. An apparatus comprising:
a system element to be coupled with a dynamic random-access memory (DRAM), the system element including:
a memory input/output (I/O) interface for connection with the DRAM, the interface including a driver and a receiver,
a memory controller for control of the DRAM, and
a timing stress testing logic for testing of the memory I/O interface, wherein the timing stress logic provides for characteristic testing to establish threshold levels for the memory I/O interface and failure testing to determine if a memory I/O interface meets threshold level requirements.

2. The apparatus of claim 1, wherein the timing stress testing logic includes:
a multiplexer to choose between a functional path and a test path,
a pattern generator to generate a test pattern,
one or more digital delay locked loops (DLLs) to provide delays in the test path,
an auto-timing component, the auto-timing component to increment the one or more DLLs through delay values for the characteristic testing of the memory I/O interface and to set the one or more DLLs at threshold levels for the failure test of the memory I/O interface, and
an I/O pattern comparator to compare resulting signals from the memory I/O interface to the test pattern to determine passing or failing of the memory I/O interface.

3. The apparatus of claim 2, wherein the one or more DLLs include a first DLL coupled with the driver and a second DLL coupled with the receiver.

4. The apparatus of claim 3, further comprising a first finite state machine to set a delay of the first DLL and a second finite state machine to set a delay of the second DLL.

5. The apparatus of claim 4, wherein the auto-timing component is to control operation of the first finite state machine and the second finite state machine for the characteristic testing of the memory I/O interface and for the failure testing of the memory I/O interface.

6. The apparatus of claim 5, wherein the auto-timing component is operable to increment the first finite state machine and the second finite state machine through a plurality of increasing delay values for the characterization test of the memory device.

7. The apparatus of claim 5, wherein the auto-timing component is operable to set the first finite state machine and the second finite state machine at the threshold levels for the failure test of the memory I/O interface.

8. The apparatus of claim 2, wherein the driver and receiver are coupled in the memory I/O interface with a micro-bump connection.

9. The apparatus of claim 8, wherein the system element includes a plurality of through silicon vias (TSVs), including a first TSV coupled with the micro-bump.

10. The apparatus of claim 1, wherein the memory controller and timing stress testing logic are separate elements of the system element.

11. The apparatus of claim 1, wherein the timing stress testing logic is a portion of the system element.

12. The apparatus of claim 1, wherein the system element is a system on chip (SoC).

13. The apparatus of claim 1, further comprising a memory stack coupled with the system element, the memory stack including one or more DRAM layers.

14. A method comprising:
selecting a test process for a memory I/O interface, wherein the test process is one of a characteristic test to establish threshold levels for the memory I/O interface or a failure test for a unit including the memory I/O interface to determine if the unit meets threshold level requirements;
commencing the selected test process for the memory I/O interface;
generating a test pattern for the memory I/O interface;
switching a signal path to an I/O interface test path, wherein the signal path may be switched to either the I/O interface test path or a functional path;
setting one or more delays for the signal path;
applying the test pattern to the memory I/O interface and detecting an output from the memory I/O interface;
comparing the output from the memory I/O interface with the test pattern;
for characteristic testing, establishing threshold levels based on the comparison of the output from the memory I/O interface with the test pattern; and
for failure testing, determining whether the unit including the memory I/O interface meets threshold level requirements based on the comparison of the output of the memory I/O interface with the test pattern.

15. The method of claim 14, wherein the characteristic testing of the memory I/O interface and the failure testing of the memory I/O interface utilize a same timing stress logic.

16. The method of claim 15, wherein, for the characteristic testing of the memory I/O interface, setting the one or more delays includes setting the one or more delays at an initial setting.

17. The method of claim 15, wherein the characteristic testing of the memory I/O interface further includes incrementing the one or more delays for a subsequent comparison if the comparison between the output and the test pattern does not indicate a failure.

18. The method of claim 15, wherein, for the failure testing of the unit including memory I/O interface, setting the one or more delays for the signal path includes setting the delays at a failure threshold setting.

19. The method of claim 18, wherein the failure threshold setting is established by a characterization test of the memory I/O interface.

20. The method of claim 14, wherein the test process occurs without attachment of memory to the memory I/O interface.

21. A system comprising:
a processor to process data for the system;
a transmitter, receiver, or both coupled with an omnidirectional antenna to transmit data, receive data, or both; and
a combined memory device including a system on chip (SoC) and a memory stack including one or more DRAM layers, the memory stack being coupled to SoC by a micro-bump connection, the system element includes a plurality of through silicon vias (TSVs), including a first TSV coupled with a first micro-bump;
wherein the SoC includes:
a memory input/output (I/O) interface, the interface including a driver and a receiver,
a memory controller for control of the DRAM, and
a timing stress testing logic for testing of the memory I/O interface, wherein the timing stress logic provides for characteristic testing to establish threshold levels for the memory I/O interface and failure testing to determine if a memory I/O interface meets threshold level requirements.

22. The system of claim 21, wherein the timing stress testing logic including:
a multiplexer to choose between a functional path and a test path,
a pattern generator to generate a test pattern,
one or more digital delay locked loops (DLLs) to provide delays in the test path,
an auto-timing component, the auto-timing component to increment the one or more DLLs through delay values for the characteristic testing of the memory I/O interface and to set the one or more DLLs at threshold levels for the failure test of the memory I/O interface, and
an I/O pattern comparator to compare resulting signals from the memory I/O interface to the test pattern to determine passing or failing of the memory I/O interface.

23. The system of claim 22, wherein the one or more DLLs include a first DLL coupled with the driver and a second DLL coupled with the receiver.

24. The system of claim 23, further comprising a first finite state machine to set a delay of the first DLL and a second finite state machine to set a delay of the second DLL.

25. The system of claim 24, wherein the auto-timing component to control operation of the first finite state machine and the second finite state machine for the characteristic testing of the memory I/O interface and for the failure testing of the memory I/O interface.

26. A non-transitory computer-readable storage medium having stored thereon data representing sequences of instructions that, when executed by a processor, cause the processor to perform operations comprising:
selecting a test process for a memory I/O interface, wherein the test process is one of a characteristic test to establish threshold levels for the memory I/O interface or a failure test for a unit including the memory I/O interface to determine if the unit meets threshold level requirements;
commencing a test process for a memory I/O interface, wherein the test process is one of a characteristic test to establish threshold levels for the memory I/O interface or a failure test for a unit including the memory I/O interface to determine if the unit meets threshold level requirements;
commencing the selected test process for the memory I/O interface;
switching a signal path to an I/O interface test path, wherein the signal path may be switched to either the I/O interface test path or a functional path;
setting one or more delays for the signal path;
applying the test pattern to the memory I/O interface and detecting an output from the memory I/O interface;
comparing the output from the memory I/O interface with the test pattern;
for characteristic testing, establishing threshold levels based on the comparison of the output from the memory I/O interface with the test pattern; and
for failure testing, determining whether the unit including the memory I/O interface meets threshold level requirements based on the comparison of the output of the memory I/O interface with the test pattern.

* * * * *